(12) United States Patent
Song

(10) Patent No.: US 6,348,812 B1
(45) Date of Patent: Feb. 19, 2002

(54) DYNAMIC PROGRAMMABLE LOGIC ARRAY THAT CAN BE REPROGRAMMED AND A METHOD OF USE

(75) Inventor: Seungyoon P. Song, Palo Alto, CA (US)

(73) Assignee: Elan Research, Palo Alto, CA (US)

( * ) Notice: Subject to any disclaimer, the term of this patent is extended or adjusted under 35 U.S.C. 154(b) by 0 days.

(21) Appl. No.: 09/609,490

(22) Filed: Jul. 5, 2000

(51) Int. Cl.[7] .......................... H03K 19/177; G06F 7/38
(52) U.S. Cl. .............................. 326/40; 326/38; 326/39; 326/41; 326/113
(58) Field of Search .............................. 326/38, 39, 40, 326/41, 113; 365/189.05

(56) References Cited

U.S. PATENT DOCUMENTS

| | | | | |
|---|---|---|---|---|
| 4,995,004 A | * | 2/1991 | Lee ........................ | 365/189.11 |
| 5,559,449 A | * | 9/1996 | Padoan et al. ................. | 326/40 |
| 5,568,062 A | * | 10/1996 | Kaplinsky .................... | 326/27 |
| 5,812,792 A | * | 9/1998 | Haddock et al. ....... | 395/200.79 |
| 6,262,597 B1 | * | 7/2001 | Bauer et al. .................. | 326/41 |

FOREIGN PATENT DOCUMENTS

| JP | 58147236 | * 9/1983 | .................. 326/40 |
|---|---|---|---|

OTHER PUBLICATIONS

IBM Technical Disclosure Bulletin, Feb. 1992, vol. 34, Issue 9, pp. 158–159.*

* cited by examiner

*Primary Examiner*—Michael Tokar
*Assistant Examiner*—Steven S. Paik
(74) *Attorney, Agent, or Firm*—Sawyer Law Group LLP

(57) ABSTRACT

A dynamic PLA (DPLA) that combines registers and dynamic PLA to make the array "reprogrammable" after the array is built is disclosed. The DPLA comprises at least one logic plane; and at least one reprogrammable evaluate module within the at least one logic plane. The at least one reprogrammable evaluate module includes a first program input, a second program input, a storage element coupled to the first and second program inputs, and an input pass transistor whose gate is coupled to the output of the storage element and whose source and drain are coupled to a control input and the gate of an evaluate transistor. In such a DPLA, the AND plane and OR plane are fully populated with reprogrammable evaluate modules such that every input signal can be programmed to affect every AND term output and every AND term signal can be programmed to affect every OR term output.

13 Claims, 7 Drawing Sheets

DYNAMIC PROGRAMMABLE LOGIC ARRAY THAT CAN BE REPROGRAMMED AND A METHOD OF USE

FIELD OF THE INVENTION

The present invention relates generally to dynamic programmable logic arrays (DPLAs) and specifically to a DPLA that can be reprogrammed

BACKGROUND OF THE INVENTION

Dynamic programmable logic arrays (DPLAs) are utilized extensively. As shown in FIG. 1, a DPLA 5 includes input signals 2 to an AND plane 10 whose outputs 18 are then the inputs to an OR plane 14 that produces the output signals 20. The outputs of the AND plane 10 are known as AND term signals (Al to Am). The outputs of the OR plane are known as OR term signals (O1 to On). FIG. 1 shows k number of inputs, m number of AND term signals, and n number of OR term signals. The AND plane 10 further comprises multiple NOR term generators 12, each of which outputs a wired-NOR signal 18 that is first precharged to Vcc (the supply voltage) and then conditionally discharged to GND (the ground voltage). The Vcc and GND can represent high (TRUE) and low (FALSE) logic states, respectively. Similarly, the OR plane 14 also comprises multiple NOR term generators 16, each of which outputs a wired NOR signal 20 that is first charged to high logic level and then conditionally discharged to low. logic level. For simplicity, the clocks that control the precharge and discharge are not shown in FIG. 1.

FIG. 2 shows two NOR term generators 12 in the AND plane. The wired-NOR signal 30 is discharged if one or more input signals 2 that are "programmed" to affect this output signal are high. An input signal 2 is programmed to affect an output signal by providing an evaluate circuitry 32 controlled by the input signal 2. FIG. 2 shows that the input signals I1 and I2 are programmed to affect the AND term signals A1 and A2. If the evaluate circuitry labeled 34 were not provided, for example, then the input signal I1 cannot affect the AND term signal A1 while it still affects the AND term signal A2.

FIG. 3 shows a conventional evaluate circuitry 38 for DPLA and the precharge transistor 40 and the discharge transistor 42 for the AND term signal. This precharge and conditional discharge circuitry is controlled in two non-overlapping phases, known as precharge and evaluate. During the precharge phase, both CLKP and CLKD are held low so that precharge transistor 40 is turned on and the discharge transistor 42 is turned off, forcing the output signal NL to be high. During the evaluate phase, both CLKP and CLKD are held high so that the precharge transistor 40 is turned off and the discharge transistor 42 is turned on. During the evaluate phase, if the input signal 46 is high to turn on the evaluate transistor 44, then the charge stored at the output signal NL is discharged via the transistors 44 and 42, resulting in the signal NL being low. If on the other hand, if the input signal 46 is low during the evaluate phase, the evaluate transistor 44 is turned off and the charge stored at the output signal NL remains high. The input signal 46 must not change during the evaluate phase to avoid falsely discharging the output signal NL.

A NOR term generator 12, which comprises one precharge transistor and one discharge transistor and one evaluate circuitry, works as follows. During the precharge phase, the precharge transistor 40 is turned on and the discharge transistor 42 is turned off, forcing the output signal NL to be high. During the evaluate phase, the precharge transistor 40 is turned off and the discharge transistor 42 is turned on. During the evaluate phase, if one or more input signals that are programmed to affect this output are high, the charge stored at the output signal is discharged and NL becomes low. If none of the input signals are high, then there is no path for the charge stored at NL to be discharged and the NL remains high. The NOR term generators 16 in the OR plane 14 works as same as those in the AND plane 10.

A detailed description of DPLA can be found in "Principles of C-MOS VLSI Design" by N. H. Weste and K. Eshraghian, Addison-Wesley, $2^{nd}$ Edition, 1993, Chapter 8, pages 592–602 or in the U.S. Pat. No. 4,769,562.

Accordingly, a DPLA produces a predetermined set of outputs for a given set of inputs. Each output is a sum-of-products of a subset of the inputs. The DPLA implements the sum-of products functions by precharging and discharging wired-NOR circuits that are built within the array. These functions are programmed when a dynamic PLA is built such that the array can only produce the same set of output signals for a given set of input signals. A dynamic PLA is "programmable" only in the sense that it is easy to implement desired functions within the array when the array is built but not in the sense that the array can be programmed to provide different functions once the array is built. Therefore, if a different function is desired the DPLA is inflexible and must be replaced after being programmed.

Accordingly, what is needed is a system and method that overcomes the above mentioned problems. The present invention addresses such a need.

SUMMARY OF THE INVENTION

A dynamic PLA (DPLA) that combines registers and dynamic PLA to make the array "reprogrammable" after the array is built is disclosed. The DPLA comprises at least one logic plane; and at least one reprogrammable evaluate module within the at least one logic plane. The at least one reprogrammable evaluate module includes a first program input, a second program input and a storage element coupled to the first and second program inputs, and an input pass transistor whose gate is coupled to the output of the storage element and whose source and drain are coupled to a control input and the gate of an evaluate transistor. The storage element is written by placing a desired value on one of the first and second program inputs and asserting a signal at the other of the first and second program inputs.

A system and method in accordance with the present invention provides a dynamic PLA which is reprogrammable. In such a DPLA, the AND plane and OR plane are fully populated with reprogrammable evaluate modules such that every input signal can be programmed to affect every AND term output and every AND term signal can be programmed to affect every OR term output. In so doing, the DPLA can be reprogrammed after a device is built to allow for a change in functionality of the device.

DETAILED DESCRIPTION

The present invention relates generally to dynamic programmable logic arrays (DPLA) and specifically to a DPLA that can be reprogrammed. The following description is presented to enable one of ordinary skilled in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

A system and method in accordance with the present invention provides a dynamic PLA which is reprogrammable. In such a DPLA, the AND plane and OR plane are fully populated with reprogrammable evaluate modules, such that every input signal can be programmed to affect every AND term output and every AND term signal can be programmed to affect every OR term output.

Figure 4:
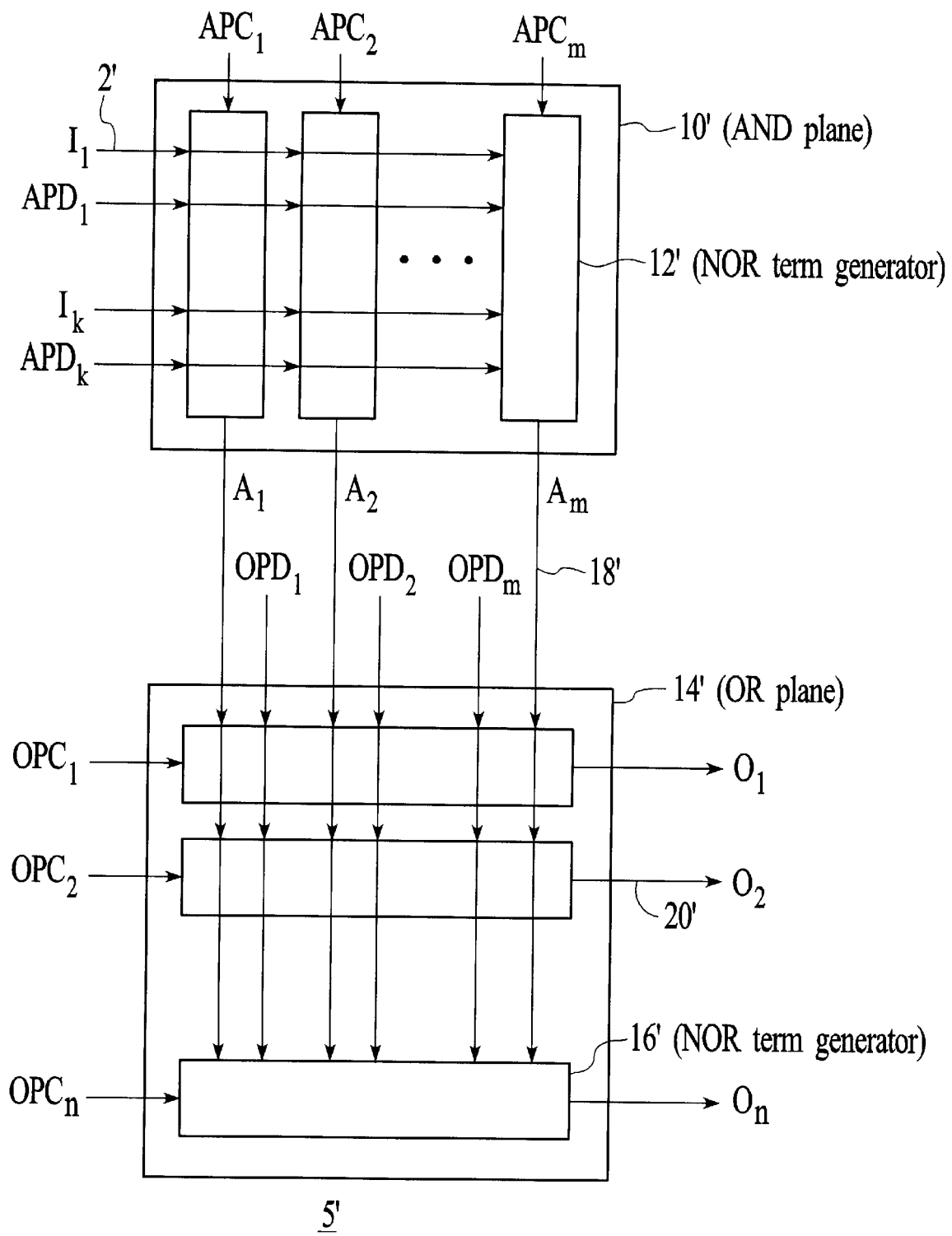
FIG. 4 shows a reprogrammable dynamic programmable logic array (DPLA) in accordance with the present invention.
Figure 5:
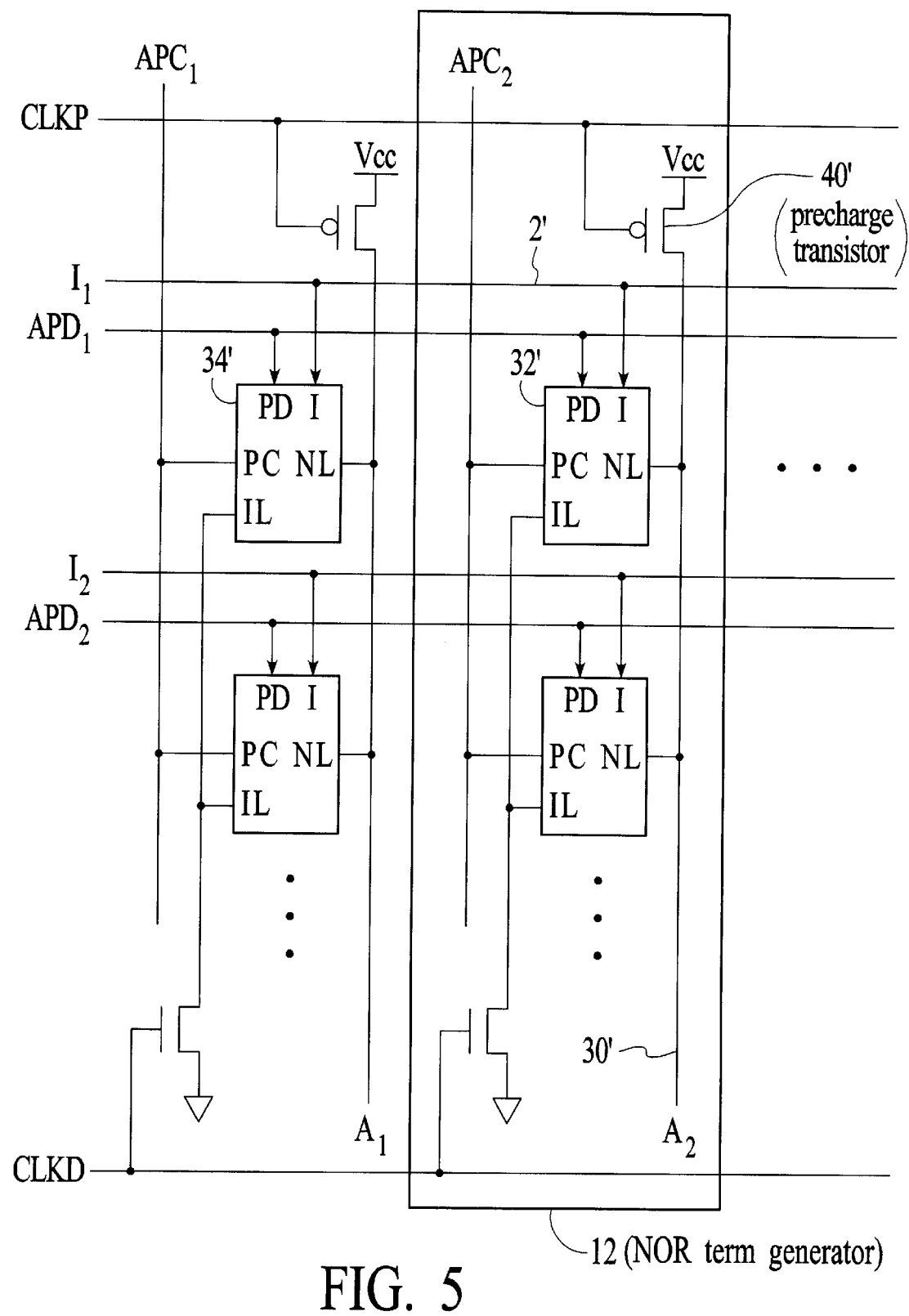
FIG. 5 shows two NOR term generators in the AND plane that is populated with reprogrammable evaluate modules in accordance with the present invention.

FIG. 4 shows a dynamic programmable logic array (DPLA) 5' in accordance with the present invention. The elements of DPLA 5' that are similar to DPLA 5 have the same reference numerals. The principal difference between DPLA 5' and DPLA 5 is that the signals APC, APD, OPC, and OPD are present and used for reprogramming in DPLA 5' as shown in FIG. 5.

Figure 1:
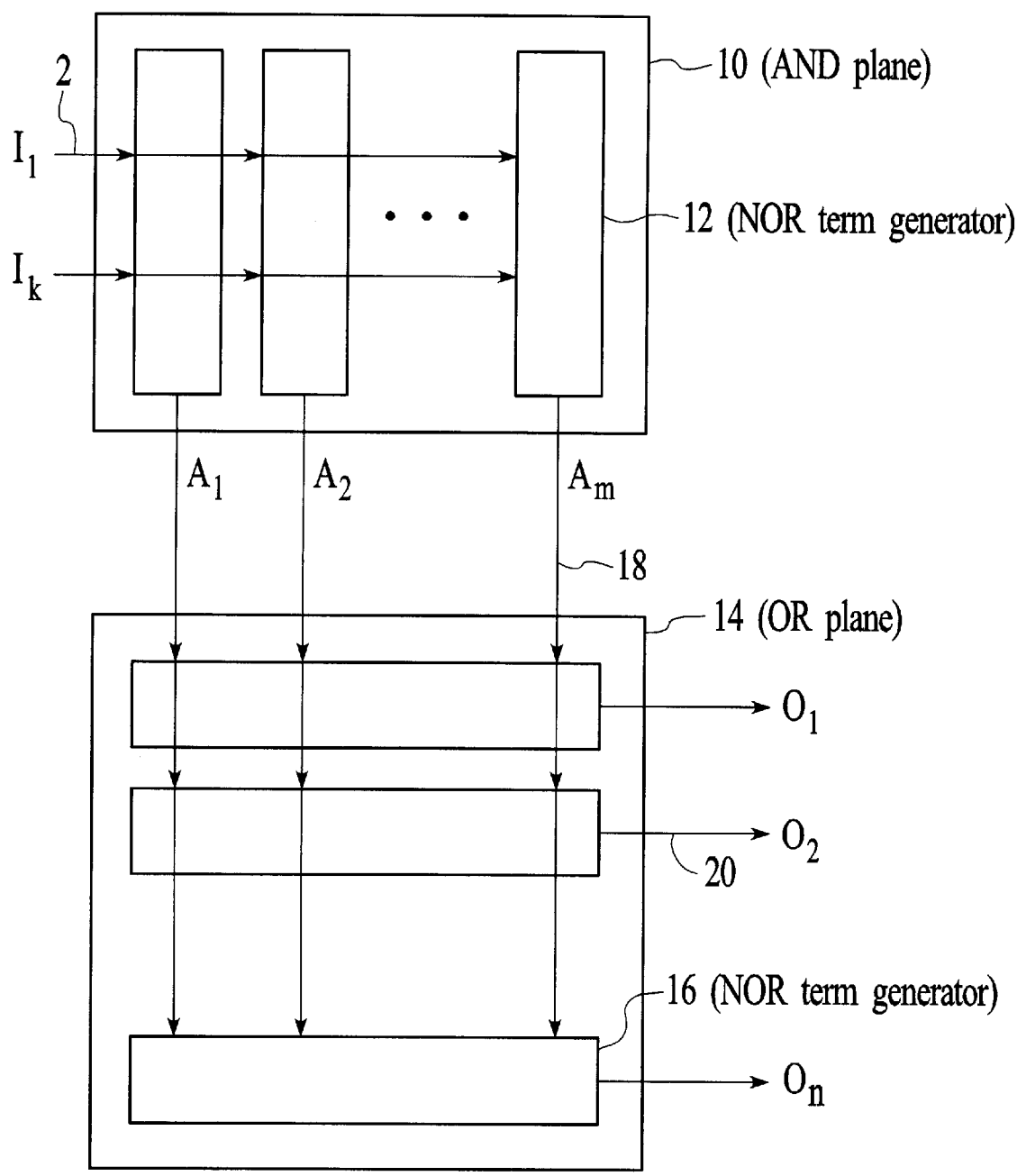
FIG. 1 shows a conventional dynamic programmable logic array (DPLA).
Figure 2:
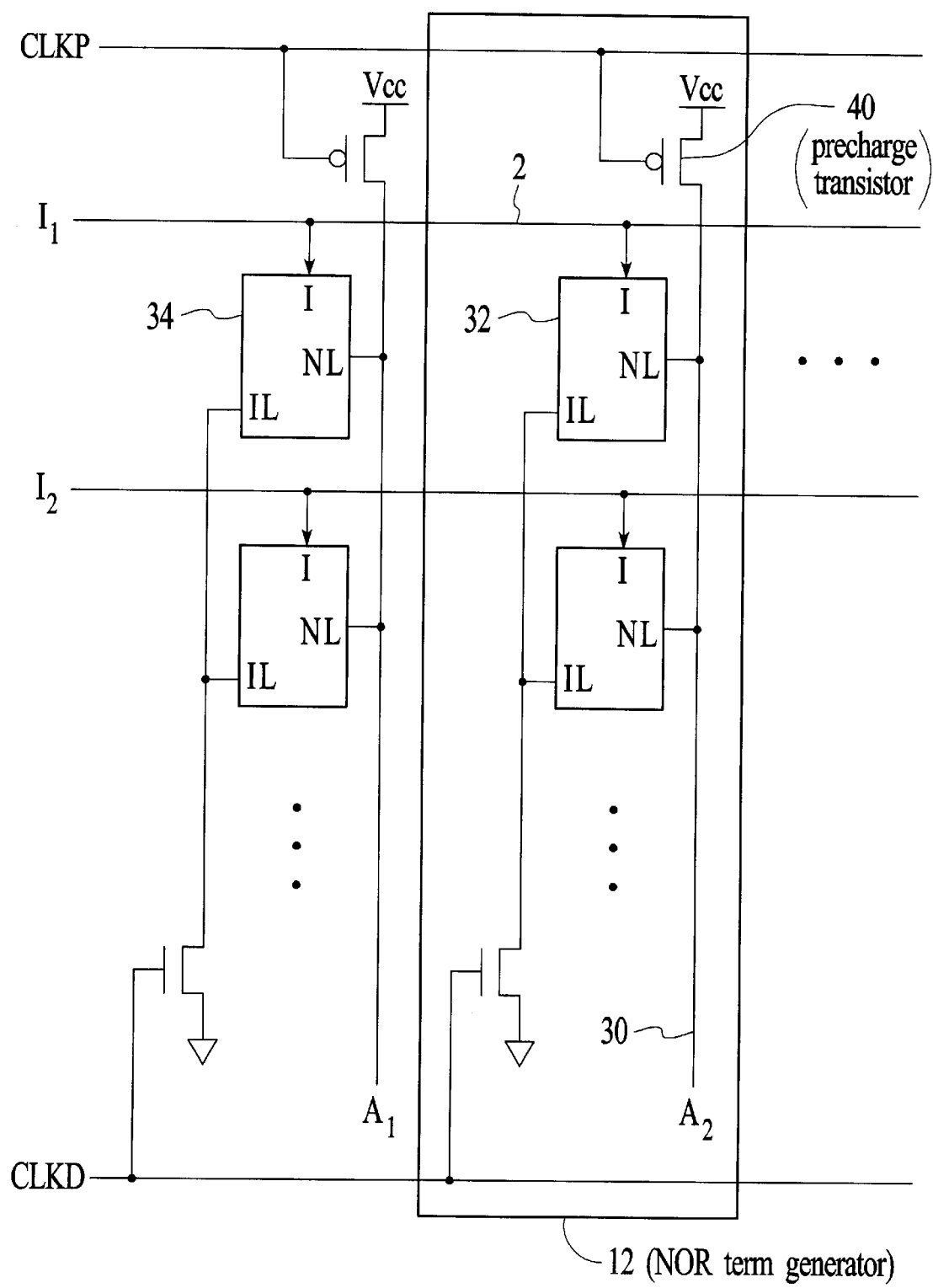
FIG. 2 shows two NOR term generators in the AND plane.
Figure 3:
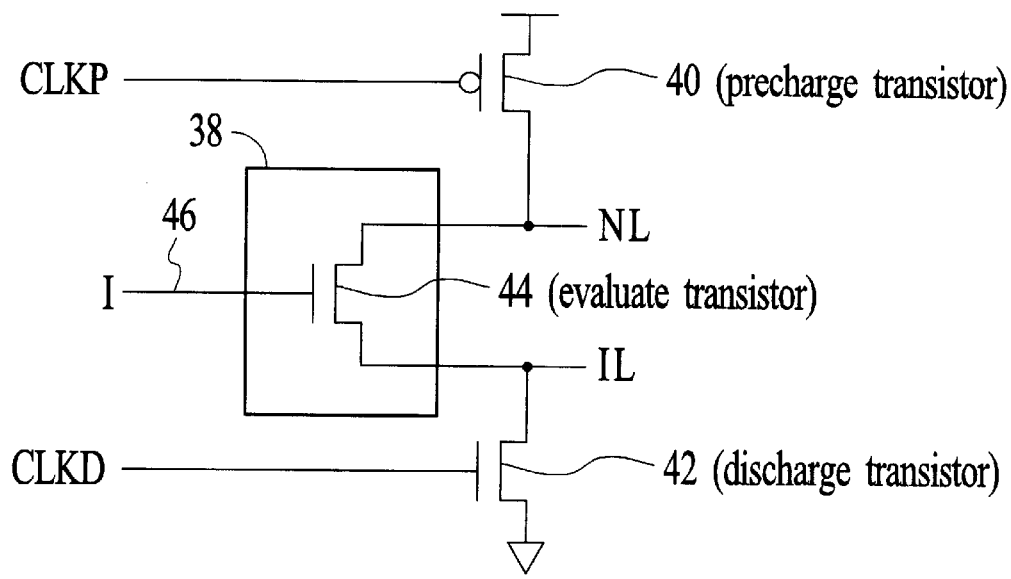
FIG. 3 shows a conventional evaluate circuitry for DPLA and the precharge transistor and the discharge transistor for the AND term signal.

In DPLAs a reprogrammable evaluate module is utilized to replace the each evaluate circuitry required in the conventional DPLA of FIG. 1. The reprogrammable evaluate module is described in detail hereinbelow.

Figure 6:
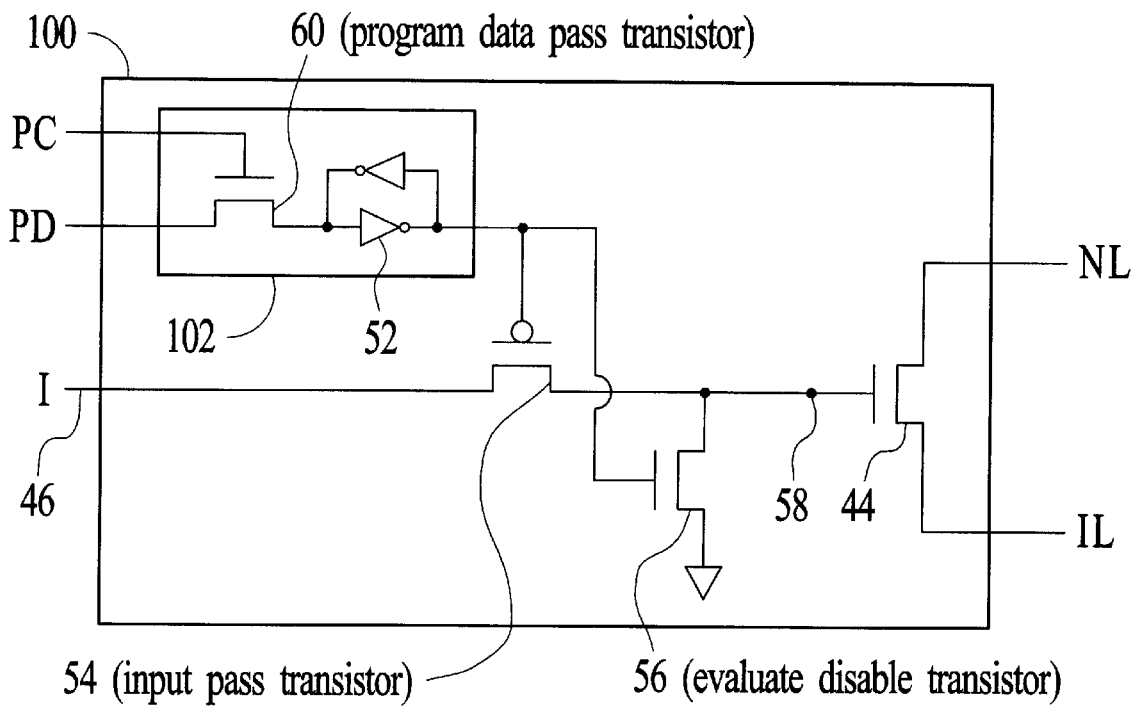
FIG. 6 shows a reprogrammable evaluate module in accordance with the present invention.

FIG. 6 shows a reprogrammable evaluate module in accordance with the present invention. The reprogrammable evaluate module 100 includes a storage element 102 (for example, a five transistor register) that can be programmed to allow an input signal 46 to affect or not affect the evaluate transistor 44. The register 102 is written by placing the desired value at the PD program data) input and asserting the PC (program control) signal high. If the value high is written to the register 102, the output of the inverter 52 is low to turn on the input pass transistor 54, allowing the input signal 46 to affect the evaluate transistor 44.

The registers 102 are reprogrammed by using the APC and APD signals in the AND plane 10 and by the OPC and OPD signals in the OR 14 plane, as shown in FIG. 4. To program the k number of registers in one NOR term generator 12, for example Am, the k-bit data to be written to the registers 102 is placed on the k-bit wide APD signals and the APCm signal is asserted high. The APCm signal must be asserted low before the evaluate phase starts to prevent the registers from changing during the evaluate phase. Similarly, the m-bit wide data is placed on the OPD signals and an OPC signal, say OPC2, is clocked (asserted to high and then subsequently to low) to program the registers 102 in the NOR term generator 16 that produces the O2 output signal.

Figure 7:
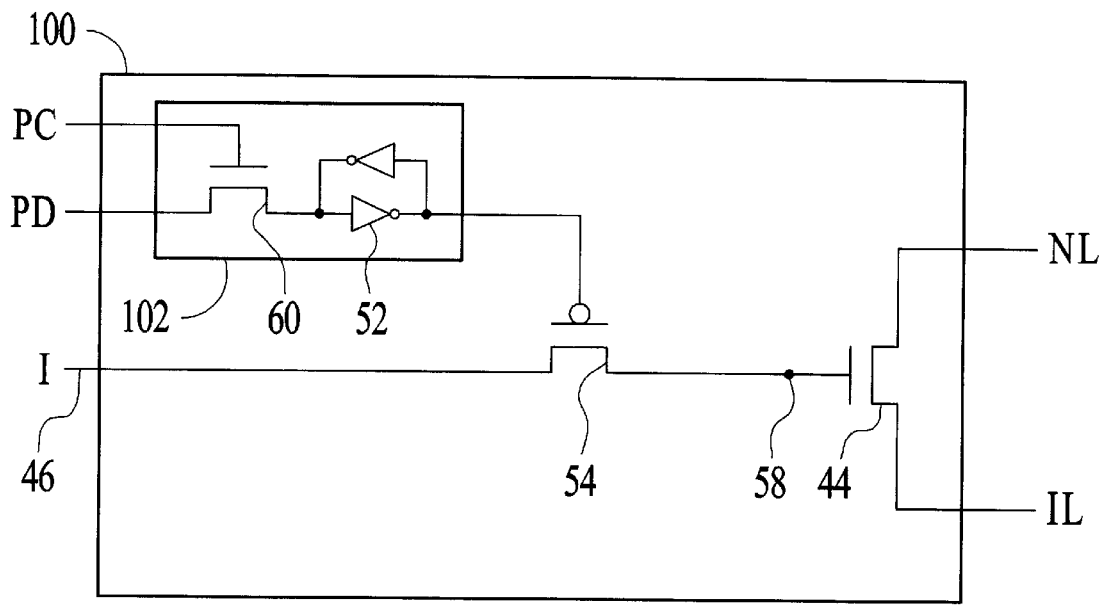
FIG. 7 shows an optimized reprogrammable evaluate module in accordance with the present invention.

An optimized reprogrammable evaluate module, shown in FIG. 7, can also be used in a reprogrammable DPLA. Here, the evaluate disable transistor (56 in FIG. 6) is removed. The evaluate disable transistor 56 is needed to fully drain any charge stored at the evaluate transistor's gate 58 before the input pass transistor 54 is turned off. For proper operation without using the evaluate disable transistor 56, the low value must be placed on the input signal 46 (to drain any charge stored at the evaluate transistor's gate 58) before the input pass transistor 54 is turned off. This can be achieved easily by placing the low value on the input signal 46 and delay asserting the PC signal, which will write the low value on the PD signal into the register 102 that turns off the input pass transistor 58, until the charge is drained.

Figure 8:
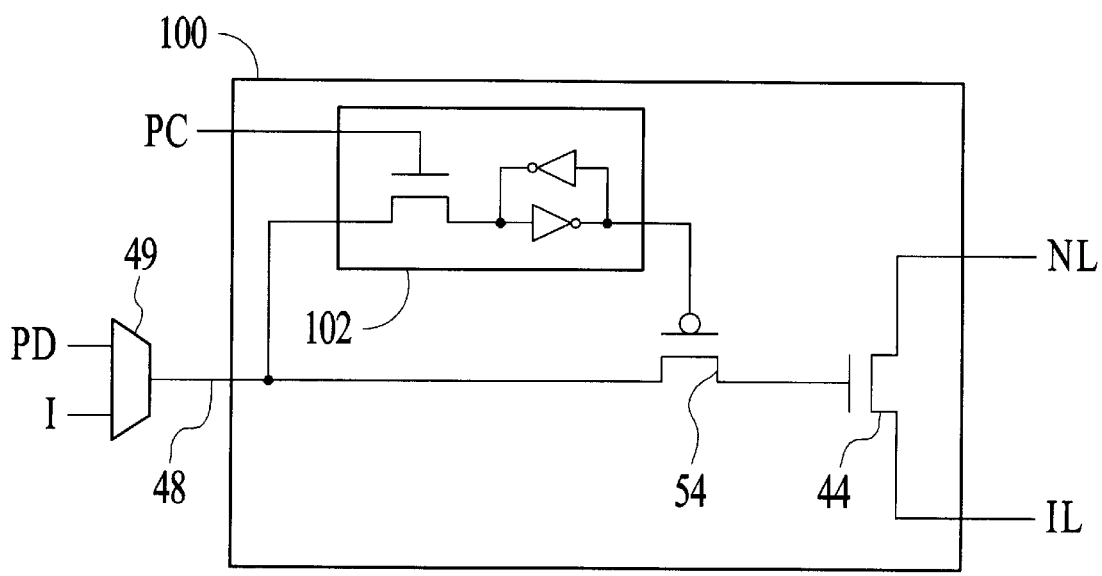
FIG. 8 shows a second optimized reprogrammable evaluate module in accordance with the present invention.
Figure 9:
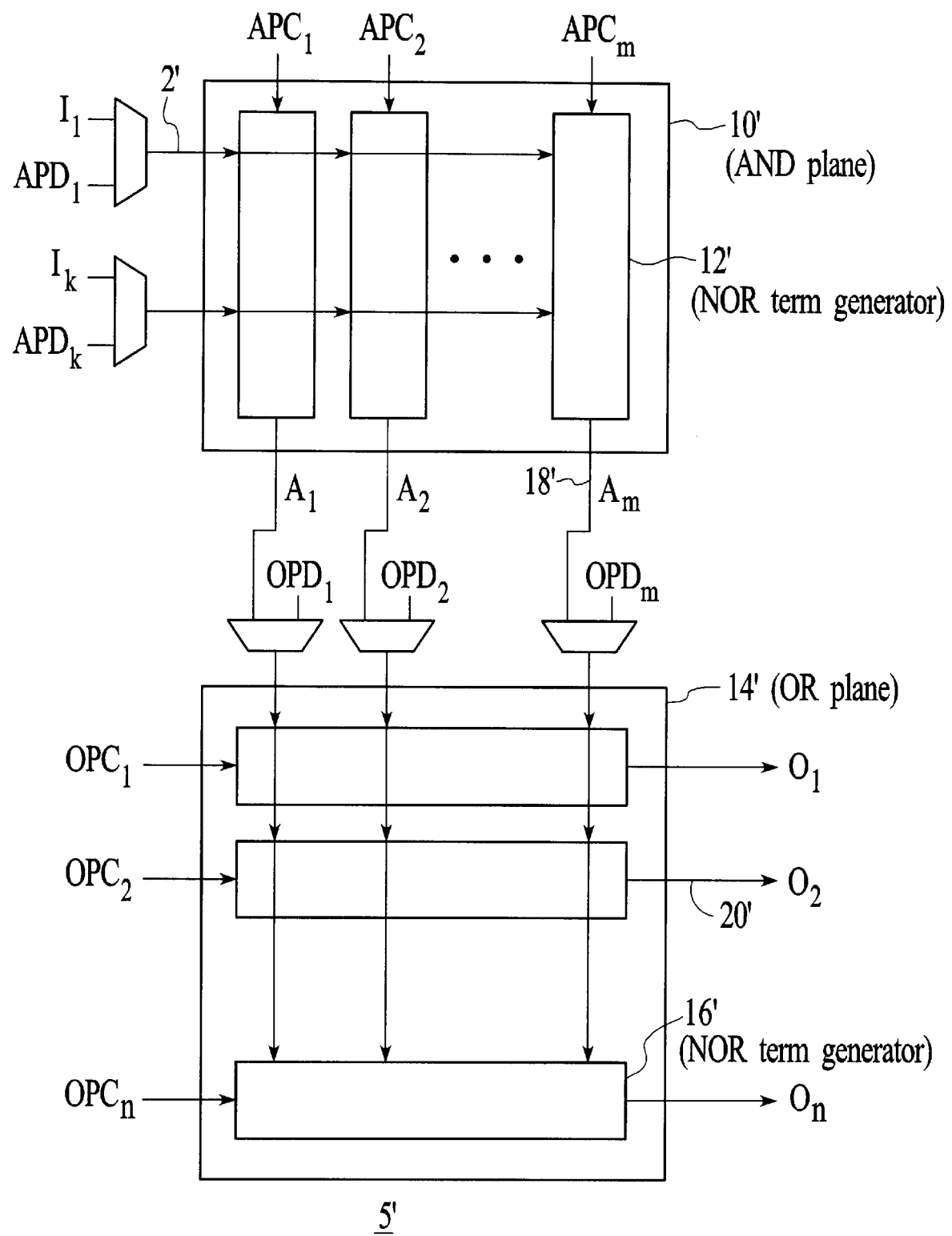
FIG. 9 shows a reprogrammable DPLA that is populated with the second optimized reprogrammable evaluate module, as shown in FIG. 8, in accordance with the present invention.

A second optimized reprogrammable evaluate module, shown in FIG. 8, can be used in a reprogrammable DPLA shown in FIG. 9. Here, the PD and the input signals are combined into one signal 48 using a multiplexer 49 that is shared by all NOR term generators in the AND or OR plane. Such a design can reduce the area needed to implement the reprogrammable DPLA but may increase the delay through the DPLA.

A system and method in accordance with the present invention provides a dynamic PLA which is reprogrammable. In such a DPLA, the AN) plane and OR plane are fully populated with reprogrammable evaluate modules such that every input signal can be programmed to affect every AND term output and every AND term signal can be programmed to affect every OR term output. In so doing, the DPLA can be reprogrammed after a device is built to allow for a change in functionality of the device.

Although the present invention has been described in accordance with the embodiments shown, one of ordinary skill in the art will readily recognize that there could be variations to the embodiments and those variations would be within the spirit and scope of the present invention.

Accordingly, many modifications may be made by one of ordinary skilled in the art without departing from the spirit and scope of the appended claims.

What is claimed is:

1. A dynamic programmable logic array (DPLA) comprising:

at least one logic plane;

at least one reprogrammable evaluate module within the at least one logic plane, the at least one reprogrammable evaluate module including a first program input, a second program input, a storage element coupled to the first and second program inputs, an input pass transistor coupled to the output of storage element and an evaluate transistor coupled to the input pass transistor, wherein the input pass transistor including a gate, source and drain, wherein the gate is coupled to the output of the storage element and the source and the drain are coupled to a control input and a gate of the evaluate transistor; and an evaluate disable transistor which includes a gate, source and drain, the gate is coupled to the output of the storage element, the source is coupled to the gate of the evaluate transistor, and the drain is coupled to the ground; and the output of the storage element turns on one of the input pass transistor or the evaluate disable transistor at any given time.

2. The DPLA of claim 1 wherein the storage element comprises a multiple transistor register.

3. The DPLA of claim 2 wherein the multiple transistor register comprises:
   a program data pass transistor, which includes a gate, source and drain, the source of the program data pass transistor is coupled to the first program input and the gate is coupled to the second program input;
   a first inverter whose input is coupled to the drain of the program data pass transistor and whose output is coupled to the output of the storage element; and
   a second inverter whose input is coupled to the output of the first inverter and whose output is coupled to the input of the first inverter, wherein the storage element is written by placing a desired value on the first program input and asserting the second program input.

4. The DPLA of claim 1 in which the control input and one of the first and second program inputs are combined into one signal.

5. A dynamic programmable logic array (DPLA) comprising:
   a first logic plane;
   a first reprogrammable evaluate module within the first logic plane;
   a second logic plane coupled to the first logic plane and for providing an output; and
   a second reprogrammable evaluate module within the second logic plane, wherein each of the first and second reprogrammable evaluate modules including a first program input, a second program input, a storage element coupled to the first and second program inputs, an input pass transistor coupled to the output of storage element and an evaluate transistor coupled to the input pass transistor, wherein the input pass transistor including a gate, source and drain, wherein the gate is coupled to the output of the storage element and the source and the drain are coupled to a control input and a gate of the evaluate transistor; and an evaluate disable transistor which includes a gate, source and drain, the gate is coupled to the output of the storage element, the source is coupled to the gate of the evaluate transistor, and the drain is coupled to the ground; and the output of the storage element turns on one of the input pass transistor or the evaluate disable transistor at any given time.

6. The DPLA of claim 5 wherein the first logic plane comprises an AND logic plane.

7. The DPLA of claim 5 wherein the second logic plane comprises an OR logic plane.

8. The DPLA of claim 6 wherein the second logic plane comprises an OR logic plane.

9. The DPLA of claim 5 wherein the storage element of the first and second reprogrammable evaluate modules comprises a multiple transistor register.

10. A reprogrammable evaluate module for use in a logic array comprising:
    a first program input;
    a second program input;
    a storage element coupled to the first and second program inputs;
    an input pass transistor coupled to the output of storage element and an evaluate transistor coupled to the input pass transistor, wherein the input pass transistor includes a gate, source and drain, wherein the gate is coupled to the output of the storage element and the source and the drain are coupled to a control input and the gate of the evaluate transistor; and
    an evaluate disable transistor which includes a gate, source and drain, the gate is coupled to the output of the storage element, the source is coupled to the gate of the evaluate transistor, and the drain is coupled to the ground; and the output of the storage element turns on one of the input pass transistor or the evaluate disable transistor at any given time.

11. The module of claim 10 wherein the storage element comprises a multiple transistor register.

12. The module of claim 11 wherein the multiple transistor register comprises:
    a program data pass transistor, which includes a gate, source and drain, the source of the program data pass transistor is coupled to the first program input and the gate is coupled to the second program input;
    a first inverter whose input is coupled to the drain of the program data pass transistor and whose output is coupled to the output of the storage element; and
    a second inverter whose input is coupled to the output of the first inverter and whose output is coupled to the input of the first inverter, wherein the storage element is written by placing a desired value on one of the first and second program inputs and asserting a signal at the other of the first and second program inputs.

13. The module of claim 10 in which the control input and one of the first and second program inputs are combined into one signal.

* * * * *